United States Patent
Moses et al.

(10) Patent No.: US 7,262,543 B2
(45) Date of Patent: Aug. 28, 2007

(54) SYSTEM AND METHOD FOR MONITORING PIEZOELECTRIC MATERIAL PERFORMANCE

(75) Inventors: Robert W. Moses, Seaford, VA (US); Robert L. Fox, deceased, late of Hayes, VA (US); by Christopher L. Fox, legal representative, Yorktown, VA (US); by Melanie L. Fox, legal representative, Hayes, VA (US); Richard L. Chattin, Newport News, VA (US); Qamar A. Shams, Yorktown, VA (US)

(73) Assignee: United States of America as represented by the Administrator of the National Aeronautics and Space Administration, Washington, DC (US)

( * ) Notice: Subject to any disclaimer, the term of this patent is extended or adjusted under 35 U.S.C. 154(b) by 221 days.

(21) Appl. No.: 10/943,655

(22) Filed: Sep. 8, 2004

(65) Prior Publication Data

US 2006/0049833 A1    Mar. 9, 2006

(51) Int. Cl.
*H01L 41/08* (2006.01)
(52) U.S. Cl. .................................. 310/316.01; 310/319
(58) Field of Classification Search .......... 310/316.01, 310/317, 319, 311
See application file for complete search history.

(56) References Cited

U.S. PATENT DOCUMENTS

| | | | | |
|---|---|---|---|---|
| 5,416,448 | A | * | 5/1995 | Wessendorf ............ 331/116 R |
| 6,016,052 | A | * | 1/2000 | Vaughn ...................... 323/355 |
| 6,111,520 | A | | 8/2000 | Allen et al. |
| 6,469,418 | B1 | * | 10/2002 | Katerberg et al. ..... 310/316.01 |
| 6,629,341 | B2 | | 10/2003 | Wilkie et al. |
| 6,956,476 | B2 | * | 10/2005 | Buess et al. ................. 340/540 |
| 6,995,496 | B1 | * | 2/2006 | Hagood et al. ............. 310/317 |
| 2002/0154029 | A1 | | 10/2002 | Watters et al. |
| 2003/0009300 | A1 | | 1/2003 | Giurgiutiu |

OTHER PUBLICATIONS

U.S. Appl. No. 10/839,445, Woodard et al.

* cited by examiner

*Primary Examiner*—Mark Budd
(74) *Attorney, Agent, or Firm*—Robin W. Edwards

(57) ABSTRACT

A system and method are provided for monitoring performance capacity of a piezoelectric material that may form part of an actuator or sensor device. A switch is used to selectively electrically couple an inductor to the piezoelectric material to form an inductor-capacitor circuit. Resonance is induced in the inductor-capacitor circuit when the switch is operated to create the circuit. The resonance of the inductor-capacitor circuit is monitored with the frequency of the resonance being indicative of performance capacity of the device's piezoelectric material.

33 Claims, 3 Drawing Sheets

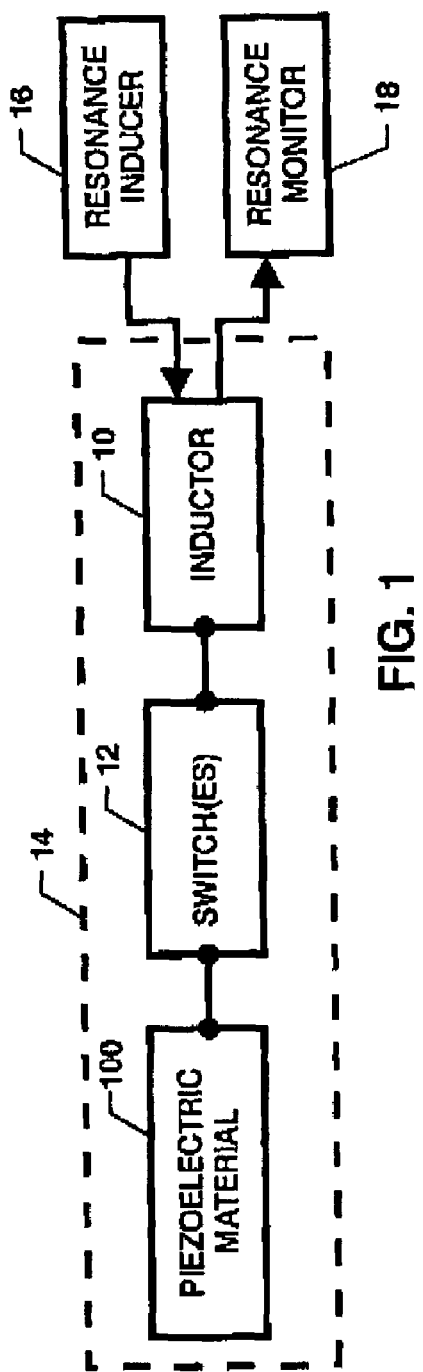
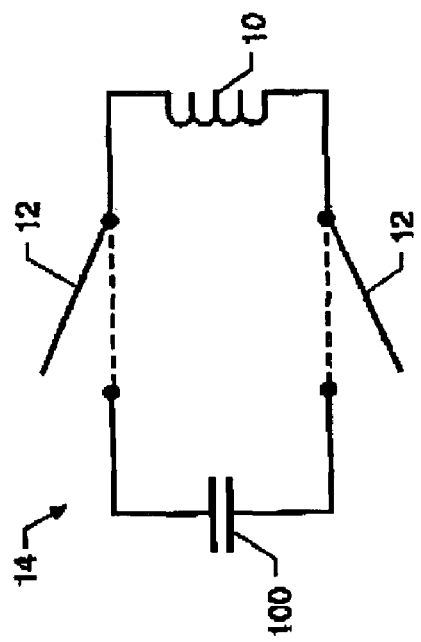

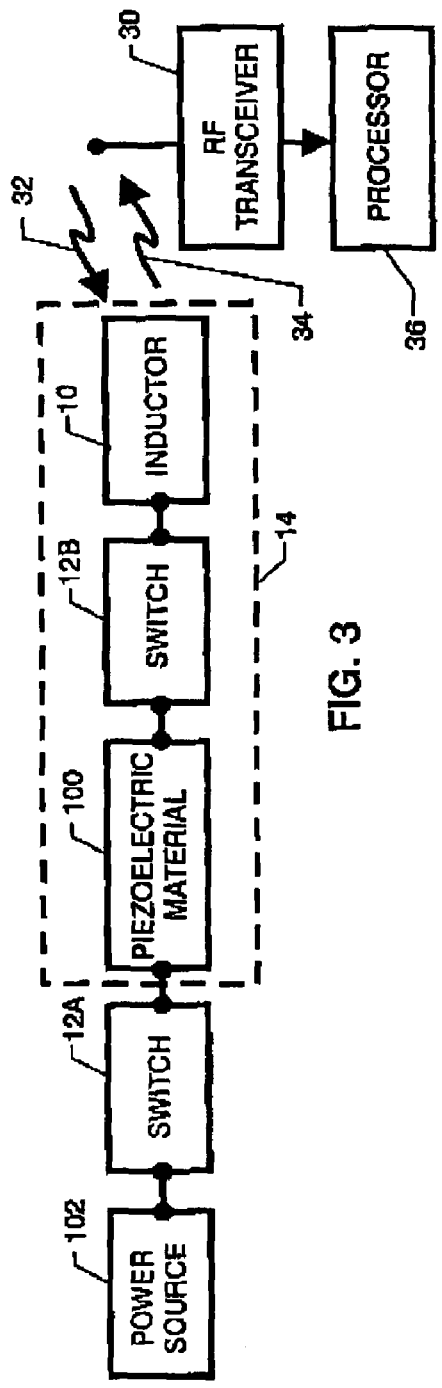
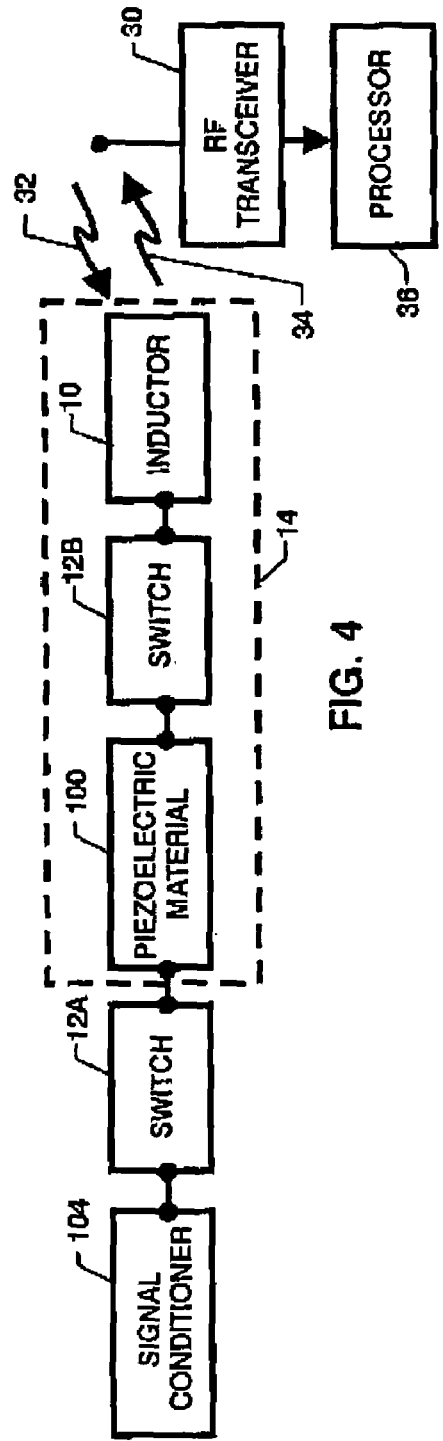

US 7,262,543 B2

SYSTEM AND METHOD FOR MONITORING PIEZOELECTRIC MATERIAL PERFORMANCE

ORIGIN OF THE INVENTION

The invention described herein was made by employees of the United States Government and may be manufactured and used by or for the Government for governmental purposes without the payment of any royalties thereon or therefor.

BACKGROUND OF THE INVENTION

1. Field of the Invention

This invention relates to piezoelectric material performance. More specifically, the invention is a system and method for monitoring piezoelectric material, such as the type used in actuators and sensors, in order to evaluate the piezoelectric material's performance capacity.

2. Description of the Related Art

Piezoelectric material-based sensors and actuators are used extensively in aircraft, spacecraft, and in a wide variety of other electromechanical applications to include automotive noise control, automotive airbag sensing circuitry, and traffic control sensing circuitry, just to name a few. In general, these are small actuators/sensors that are easily embedded in structures. Unfortunately, once embedded in structures, it is difficult to quickly and quantitatively ascertain the performance capacity of the actuator/sensor devices which may deteriorate over time due to changes in the piezoelectric material.

SUMMARY OF THE INVENTION

Accordingly, it is an object of the present invention to provide a method and system for monitoring the performance capacity of piezoelectric materials that may be used in various actuator and/or sensor applications.

Other objects and advantages of the present invention will become more obvious hereinafter in the specification and drawings.

In accordance with the present invention, a system and method are provided for monitoring performance capacity of a piezoelectric material. A switch is used to selectively electrically couple an inductor to the piezoelectric material, whereby an inductor-capacitor circuit is formed with the piezoelectric material forming the capacitor in the inductor-capacitor circuit. The switch can also be operated to electrically decouple the inductor from the piezoelectric material. Resonance is induced in the inductor-capacitor circuit when the switch is operated to create the circuit. The resonance of the inductor-capacitor circuit is monitored with the frequency of the resonance being indicative of performance capacity of the piezoelectric material. The system and method can be used in conjunction with piezoelectric actuator and/or sensor devices in order to evaluate the performance capacity of the devices.

BRIEF DESCRIPTION OF THE DRAWINGS

FIG. 1 is a block diagram of a system for monitoring the performance capacity of a piezoelectric material in accordance with the present invention;

FIG. 2 is a circuit schematic of the inductor-capacitor circuit formed for the monitoring process of the present invention;

FIG. 3 is a schematic view of a piezoelectric actuator device coupled to the system that monitors the performance capacity of the device in accordance with the present invention;

FIG. 4 is a schematic view of a piezoelectric sensor device coupled to the system that monitors the performance capacity of the device in accordance with the present invention.

DETAILED DESCRIPTION OF THE INVENTION

Figure 5:
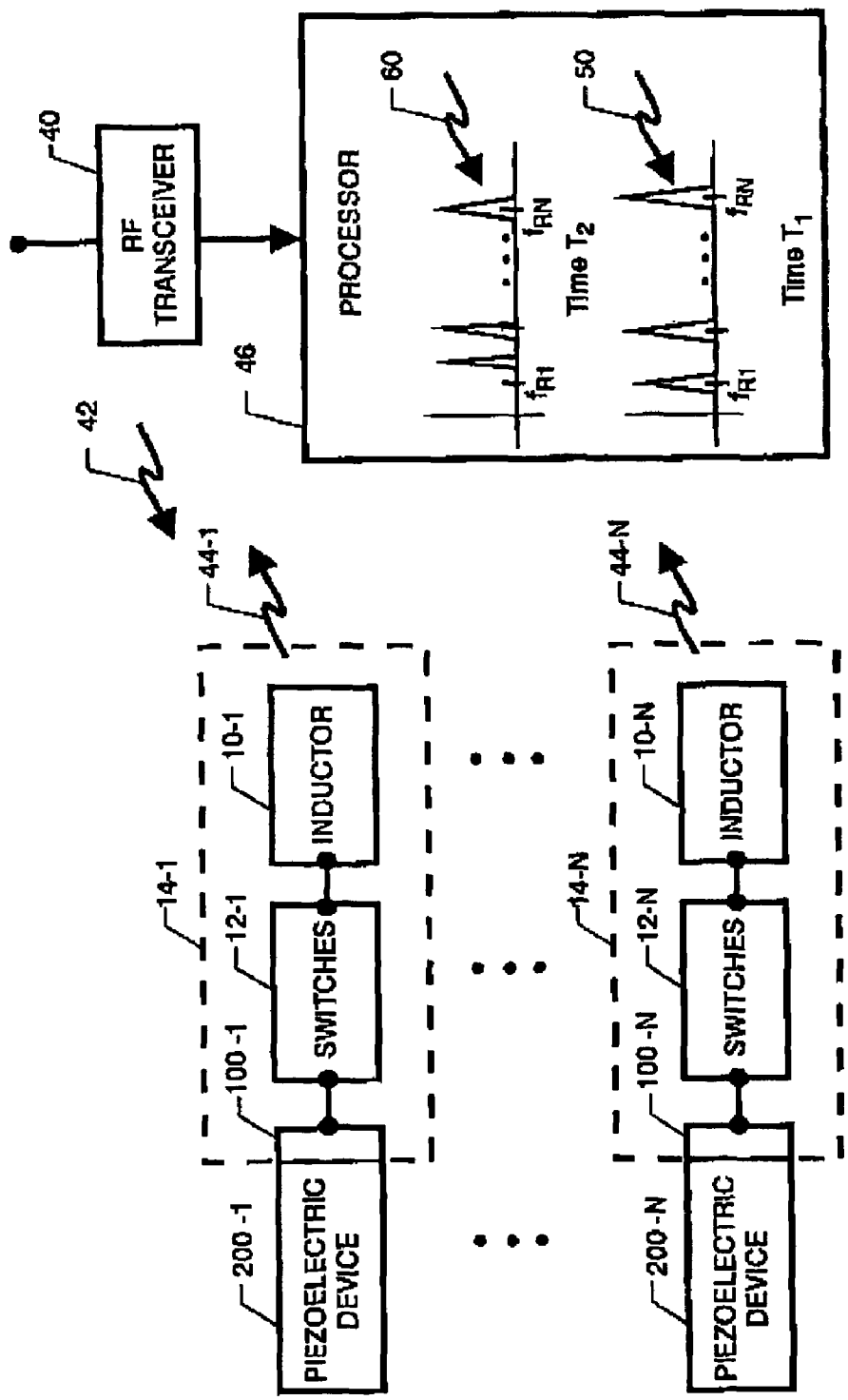
FIG. 5 is a block diagram illustrating the system and method of the present invention for simultaneously monitoring the performance capacity of a plurality of piezoelectric devices in accordance with the present invention.

Referring now to the drawings, and more particularly to FIG. 1, a block diagram illustrates the basic elements comprising a system for monitoring the performance of a piezoelectric material 100 in accordance with the present invention. For many applications, as will be explained further below, piezoelectric material 100 will be an element of a device (e.g., an actuator or sensor) in which the piezoelectric material forms the device's electromechanical work producing or sensing component. In these applications, the performance capacity of piezoelectric material 100 serves as an indicator of the performance capacity of the device itself. However, the present invention can also be used to monitor performance capacity of piezoelectric material 100 in isolation as illustrated in FIG. 1.

An inductor 10 is selectively coupled to piezoelectric material 100 by one or more switch(es) 12 such that an inductor-capacitor circuit 14 (e.g., a serial or parallel circuit) includes inductor 10 and piezoelectric material 100, where piezoelectric material 100 forms the capacitor portion of circuit 14. Inductor 10 should be stable in terms of its inductance value when piezoelectric material 100 forms the capacitor portion of circuit 14. Accordingly, inductor 10 is typically a simple coil or spiral of wire with the wire size and number of coils/spirals being selected such that the resulting inductor-capacitor circuit 14 will be tuned to a selected resonant frequency $f_R$. The circuit schematic equivalent of inductor-capacitor circuit 14 is shown in FIG. 2 where the dashed line coupling (i.e., switch(es) 12 are closed) of inductor 10 to piezoelectric material 100 depict a monitoring state of the present invention. The solid line coupling (i.e., switch(es) 12 are open) of inductor 10 from piezoelectric material 100 depict a non-monitoring state. The type and number of switches 12 used to create the open and closed circuit is not a limitation of the present invention. For example, switches 12 could be manually or remotely controlled, could be closed/opened by the insertion/removal of an electrical plug, controlled in a wireless fashion, etc., without departing from the scope of the present invention.

With inductor-capacitor circuit 14 in the monitoring state, a resonance inducer 16 provides energy to inductor-capacitor circuit 14 to cause circuit 14 to resonate and generate energy at a frequency to be monitored or $f_M$, where $f_M$ is a function of the current inductance and current capacitance of circuit 14. Since inductor 10 was chosen to have a stable inductance value, monitored frequency $f_M$ changes with changes in the capacitance of piezoelectric material 100. Large changes in capacitance of piezoelectric material 100 will result when piezoelectric material 100 undergoes degradation, e.g., mechanical degradation such as cracks or breaks, fatigue due to excessive mechanically-induced or electrically-induced stresses that build up over time or are caused by sudden mechanical or electrical overloads, etc. Thus, the present invention monitors the performance capacity of piezoelectric material 100 by continually or occasionally inducing/monitoring frequency $f_M$ and comparing same to the originally tuned resonant frequency $f_R$. Differences between $f_R$ and $f_M$ will be significant when the performance capacity of piezoelectric material 100 has changed. Note that if the monitored frequency $f_M$ is different or shifted with respect to the original resonant frequency $f_R$ but it is determined that the shift is not indicative of performance degradation, the monitored frequency $f_M$ could be used to establish a new baseline resonant frequency $f_R$. For example, the present invention could be used to track changes in resonant frequency prior to and after electrical poling of piezoelectric material 100. As is known in the art, such electrical poling typically occurs during the preparation of a piezoelectric material for use in a sensor or actuator device.

The energy provided by resonance inducer 16 can be directly (i.e., via hardware connection) or indirectly coupled to inductor-capacitor circuit 14. In terms of an indirect coupling of such resonance-inducing energy, resonance inducer 16 can be a radio frequency (RF) generator that transmits RF energy from a location that may be remote from circuit 14 where the RF energy includes resonant frequency $f_R$ of circuit 14. A resonance monitor 18 can similarly be directly or indirectly coupled to inductor-capacitor circuit 14 in order to sense/detect monitored frequency $f_M$. The energy associated with monitored frequency $f_M$ is essentially RF energy that can be sensed/detected in a remote wireless fashion. Accordingly, resonance monitor 18 can be an RF receiver tuned to be sensitive to a band that includes resonant frequency $f_R$ and possible values of monitored frequency $f_M$.

As mentioned above, piezoelectric material 100 is frequently incorporated in an actuator or sensor device. The present invention can be adapted to work with the devices in order to monitor the performance capacity thereof by monitoring the performance capacity of the device's piezoelectric material. Accordingly, FIG. 3 illustrates a piezoelectric actuator device and an embodiment of the monitoring system of the present invention, and FIG. 4 illustrates a piezoelectric sensing device and an embodiment of the monitoring system of the present invention.

Referring first to FIG. 3, the piezoelectric actuator device includes piezoelectric material 100 and a power source 102 that is electrically coupled to material 100. To implement the present invention, switch 12A is used to selectively couple/uncouple power source 102 to/from piezoelectric material 100, while switch 12B is used to couple/uncouple inductor 10 to/from piezoelectric material 100. To monitor the frequency $f_M$ of inductor-capacitor circuit 14 when switch 12A is opened and switch 12B is closed, an RF transceiver 30 transmits RF energy 32 thereby causing circuit 14 to resonate and generate RF energy 34 at the monitored frequency $f_M$ which, in turn, is sensed by RF transceiver 30. The transmit and receive portions of transceiver 30 can be co-located or maintained at distinct locations without departing from the scope of the present invention.

The monitored frequency $f_M$ can be compared with the original tuned resonant frequency $f_R$ to determine if there are appreciable changes between $f_R$ and $f_M$ indicative of a change in the performance capacity of the piezoelectric actuator. The comparison between $f_R$ and $f_M$ can occur, for example, at a processor 36 coupled to RF transceiver 30. The original tuned resonant frequency $f_R$ can be determined/measured to form the baseline that will be compared with one or more monitored frequencies $f_M$ that are collected over a period of time. The original tuned resonant frequency $f_R$ can be stored or archived by processor 36 for comparison with the monitored frequencies $f_M$. The times for collecting monitored frequency $f_M$ can occur at regularly or irregularly scheduled intervals.

In operation, assuming the piezoelectric device is in its operational state (i.e., switch 12A is closed and switch 12B is open), the monitoring state of the present invention is implemented as follows. Inductor 10 is electrically coupled to piezoelectric material 100 by closing switch 12B. As mentioned above, the closing/opening of switch 12B can be controlled in a variety of manual, remote, hardwired or wireless fashions without departing from the scope of the present invention. With switch 12B closed, RF transceiver 30 transmits RF energy 32 in order to induce resonance in circuit 14 which results in generation of RF energy 34. Prior to monitoring frequency $f_M$ of RF energy 34, switch 12A is opened so that the current will flow through both the low-resistance inductor 10 and the high-resistance piezoelectric material 100, a situation that would not occur if power source 102 were still coupled to piezoelectric material 100 when trying to monitor $f_M$. The opening of switch 12A can be tied to the closing of switch 12B in a "smart" fashion. That is, switch 12A could be configured to sense the closing of switch 12B and then open so that the monitoring process can begin.

Referring now to FIG. 4, the piezoelectric sensor device includes piezoelectric material 100 and a signal conditioner 104 (e.g., a charge amplifier that resolves the current and/or voltage generated by the piezoelectric material into measurements of current, voltage, and/or other engineering metrics) that is electrically coupled to material 100. Monitoring the performance capacity of piezoelectric material 100 is achieved in the same fashion as described above for the piezoelectric actuator device and, therefore, need not be described further.

The present invention can be used to simultaneously monitor a plurality of piezoelectric devices as will now be described with the aid of FIG. 5. Each of a plurality of piezoelectric devices 200-1, . . . , 200-N have an inductor 10-1, . . . , 10-N coupled to the devices' piezoelectric material 100-1, . . . , 100-N via a switch 12-1, . . . , 12-N that, when closed, form inductor-capacitor circuits 14-1, . . . , 14-N. For clarity of illustration, the power source or signal conditioner associated with each of devices 200-1, . . . , 200-N, and the switches used to couple/uncouple the power source or signal conditioner from its corresponding material, have been omitted.

Inductors 10-1, . . . , 10-N are selected such that each inductor-capacitor circuit 14-1, . . . , 14-N has a unique original tuned resonant frequency $f_{R1}$, . . . , $f_{RN}$. An RF transceiver 40 is configured to generate RF energy 42 over a transmission band of frequencies to include all of $f_{R1}$, . . . , $f_{RN}$. The transmitted RF energy 42 excites each inductor-capacitor circuit 14-1, . . . , 14-N to resonance whereby corresponding RF energies 44-1, . . . , 44-N are generated. RF transceiver 40 is further configured to be sensitive to RF energies 44-1, . . . , 44-N in a reception band that includes the transmission band. A processor 46 coupled to RF transceiver 40 archives the set of original tuned resonant frequencies $f_{R1}$, . . . , $f_{RN}$ and compares them to the monitored frequencies $f_{M1}$, . . . , $f_{MN}$ associated with RF energies 44-1, . . . , 44-N. For example, processor 46 could be used to generate a spectral map 50 at a baseline time $T_1$ to identify all of the original tuned resonant frequencies $f_{R1}$, . . . , $f_{RN}$. Then, at a monitoring time $T_2$, processor 46 could be used to generate a spectral map 60 to identify all of the monitored frequencies $f_{M1}, \ldots, f_{MN}$. Processor 46 could further be used to subtract spectral map 60 from spectral map 50. If there have been no capacitative changes in any of piezoelectric materials 100-1, ..., 100-N from time $T_1$ to time $T_2$, the difference between two spectral maps each of $f_{R1}, \ldots, f_{RN}$ will be zero. However, if a spectral "spike" is present at one or more of $f_{R1}, \ldots, f_{RN}$, the associated i-th piezoelectric device may have experienced performance degradation since its monitored frequency $f_{Mi}$ is different from its original tuned resonant frequency $f_{Ri}$.

The advantages of the present invention are numerous. Performance capacity of piezoelectric materials and their devices can be diagnosed quickly and efficiently. The various switches and inductors can be partially or fully integrated with the piezoelectric device or can be included in self-contained monitoring system that is coupled to a piezoelectric device where needed. Monitoring can be accomplished using RF interrogation thereby eliminating the need to physically access the devices in order to evaluate them.

Although the invention has been described relative to a specific embodiment thereof, there are numerous variations and modifications that will be readily apparent to those skilled in the art in light of the above teachings. It is therefore to be understood that, within the scope of the appended claims, the invention may be practiced other than as specifically described.

What is claimed as new and desired to be secured by Letters Patent of the United States is:

1. A system for monitoring performance capacity of a piezoelectric material, comprising:
   a piezoelectric material;
   an inductor;
   switch means coupled to said inductor and operable to selectively (i) electrically couple said inductor to said piezoelectric material wherein an inductor-capacitor circuit is formed with said piezoelectric material forming a capacitor in said inductor-capacitor circuit, and (ii) electrically decouple said inductor from said piezoelectric material;
   means for inducing resonance in said inductor-capacitor circuit; and
   means for monitoring said resonance wherein a frequency of said resonance is indicative of performance capacity of said piezoelectric material.

2. A system as in claim 1 wherein said piezoelectric material is adapted to be coupled to a power source, and wherein said system further comprises second switch means adapted to be coupled between said power source and said piezoelectric material, said second switch means operable to (i) electrically decouple said power source from said piezoelectric material prior to a time when said resonance is to be monitored, and (ii) electrically couple said power source to said piezoelectric material after said resonance has been monitored.

3. A system as in claim 1 wherein said piezoelectric material is adapted to be coupled to a signal conditioner, and wherein said system further comprises second switch means adapted to be coupled between said signal conditioner and said piezoelectric material, said second switch means operable to (i) electrically decouple said signal conditioner from said piezoelectric material prior to a time when said resonance is to be monitored, and (ii) electrically couple said signal conditioner to said piezoelectric material after said resonance has been monitored.

4. A system as in claim 1 wherein said inductor comprises a spiraled wire.

5. A system as in claim 1 wherein said switch means is remotely controllable.

6. A system as in claim 2 wherein said switch means and said second switch means are remotely controllable.

7. A system as in claim 3 wherein said switch means and said second switch means are remotely controllable.

8. A system as in claim 1 wherein said means for inducing comprises a radio frequency generator.

9. A system as in claim 1 wherein said means for monitoring comprises a radio frequency receiver.

10. A system as in claim 1 wherein said means for inducing and said means for monitoring comprise a radio frequency (RF) transceiver for generating RF energy to induce said resonance and for receiving RF energy resulting from said resonance.

11. A system as in claim 1 wherein said means for monitoring comprises:
    means for archiving a plurality of measurements of said frequency taken over a period of time; and
    means for comparing said plurality of measurements to monitor changes in said frequency associated therewith.

12. A method of monitoring performance capacity of a piezoelectric material, comprising the steps of:
    coupling an inductor to a piezoelectric material wherein an inductor-capacitor circuit is formed with said piezoelectric material forming a capacitor in said inductor-capacitor circuit;
    inducing resonance in said inductor-capacitor circuit;
    monitoring a frequency of said resonance;
    decoupling said inductor from said piezoelectric material; and
    repeating said steps of coupling, inducing, monitoring and decoupling wherein changes in said frequency are indicative of changes in performance capacity of said piezoelectric material.

13. A method of monitoring performance capacity of a piezoelectric material, comprising the steps of:
    coupling an inductor to a piezoelectric material wherein an inductor-capacitor circuit is formed with said piezoelectric material forming a capacitor in said inductor-capacitor circuit;
    inducing resonance in said inductor-capacitor circuit;
    monitoring a frequency of said resonance;
    decoupling said inductor from said piezoelectric material; and
    repeating said steps of coupling, inducing, monitoring and decoupling wherein changes in said frequency are indicative of changes in performance capacity of said piezoelectric material;
    wherein said piezoelectric material has a power source coupled thereto, and wherein said method further comprises the step of decoupling said power source from said piezoelectric material prior to said step of monitoring.

14. A method of monitoring performance capacity of a piezoelectric material, comprising the steps of:
    coupling an inductor to a piezoelectric material wherein an inductor-capacitor circuit is formed with said piezoelectric material forming a capacitor in said inductor-capacitor circuit;
    inducing resonance in said inductor-capacitor circuit;
    monitoring a frequency of said resonance;
    decoupling said inductor from said piezoelectric material; and repeating said steps of coupling, inducing, monitoring and decoupling wherein changes in said frequency are indicative of changes in performance capacity of said piezoelectric material;

wherein said piezoelectric material has a signal conditioner coupled thereto, and wherein said method further comprises the step of decoupling said signal conditioner from said piezoelectric material prior to said step of monitoring.

15. A method according to claim 12 wherein said step of inducing comprises the step of transmitting radio frequency (RF) energy from a first location that is remote with respect to said inductor-capacitor circuit.

16. A method according to claim 15 wherein said step of monitoring comprises the step of receiving RF energy resulting from said resonance at a second location that is remote with respect to said inductor-capacitor circuit.

17. A method according to claim 16 wherein said first location and said second location are co-located with one another.

18. A method according to claim 12 wherein said step of repeating occurs at regular intervals.

19. A method according to claim 12 wherein said step of repeating occurs at irregular intervals.

20. A system for monitoring performance capacity of a device that includes one of a power source and a signal conditioner coupled to a piezoelectric material, comprising:
an inductor;
first switch means coupled to said inductor and adapted to be coupled to said piezoelectric material, said first switch means operable to selectively (i) electrically couple said inductor to said piezoelectric material wherein an inductor-capacitor circuit is formed with said piezoelectric material forming a capacitor in said inductor-capacitor circuit, and (ii) electrically decouple said inductor from said piezoelectric material;
second switch means adapted to be coupled between said piezoelectric material and one of said power source and said signal conditioner, said second switch means operable to electrically couple and decouple said piezoelectric material from said one of said power source and said signal conditioner;
means for inducing resonance in said inductor-capacitor circuit; and
means for monitoring said resonance when said second switch means is operated to decouple said piezoelectric material from said one of said power source and said signal conditioner, wherein a frequency of said resonance is indicative of performance capacity of said device.

21. A system as in claim 20 wherein said means for inducing comprises a radio frequency generator.

22. A system as in claim 20 wherein said means for monitoring comprises a radio frequency receiver.

23. A system as in claim 20 wherein a plurality of said devices are to be monitored simultaneously with each of said devices having (i) one said inductor, (ii) one said first switch means, and (iii) one said second switch means associated therewith, such that a plurality of inductor-capacitor circuits are formed when each said first switch means electrically couples a corresponding one said inductor to a corresponding one said piezoelectric material, each said inductor having an inductance such that each of said plurality of inductor-capacitor circuits has a unique resonance frequency associated therewith that is indicative of an acceptable level of performance capacity of a corresponding one of said devices, wherein said means for inducing comprises a radio frequency (RF) generator for generating RF energy across a frequency band that encompasses each said unique resonance frequency of said plurality of inductor-capacitor circuits.

24. A system as in claim 23 wherein said means for monitoring comprises:
an RF receiver for receiving each said resonance at its corresponding frequency; and
means coupled to said RF receiver for generating a spectral map using each said resonance at first and second points in time, wherein changes between said spectral map associated with said first point in time and said spectral map associated with said second point in time at each said unique resonance frequency are indicative of changes in performance capacity of corresponding ones of said devices.

25. A system as in claim 20 wherein said inductor comprises a spiraled wire.

26. A system as in claim 20 wherein said first switch means and said second switch means are remotely controllable.

27. A system for monitoring performance capacity of a piezoelectric device having one of a power source and a signal conditioner coupled thereto, comprising:
a piezoelectric device that includes a piezoelectric material coupled to one of a power source and a signal conditioner;
an inductor;
first switch means coupled to said inductor and said piezoelectric material, said first switch means operable to selectively (i) electrically couple said inductor to said piezoelectric material wherein an inductor-capacitor circuit is formed with said piezoelectric material forming a capacitor in said inductor-capacitor circuit, and (ii) electrically decouple said inductor from said piezoelectric material;
second switch means coupled between said piezoelectric material and one of said power source and said signal conditioner, said second switch means operable to electrically couple and decouple said piezoelectric material from said one of said power source and said signal conditioner;
means for inducing resonance in said inductor-capacitor circuit; and
means for monitoring said resonance when said second switch means is operated to decouple said piezoelectric material from said one of said power source and said signal conditioner, wherein a frequency of said resonance is indicative of performance capacity of said device.

28. A system as in claim 27 wherein said means for inducing comprises a radio frequency generator.

29. A system as in claim 27 wherein said means for monitoring comprises a radio frequency receiver.

30. A system as in claim 27 wherein a plurality of said devices are to be monitored simultaneously with each of said devices having a power source coupled to a piezoelectric material and with each of said devices having (i) one said inductor, (ii) one said first switch means, and (iii) one said second switch means associated therewith, such that a plurality of inductor-capacitor circuits are formed when each said first switch means electrically couples a corresponding one said inductor to a corresponding one said piezoelectric material, each said inductor having an inductance such that each of said plurality of inductor-capacitor circuits has a unique resonance frequency associated therewith that is indicative of an acceptable level of performance capacity of a corresponding one of said devices, wherein said means for inducing comprises a radio frequency (RF) generator for generating RF energy across a frequency band that encompasses each said unique resonance frequency of said plurality of inductor-capacitor circuits.

31. A system as in claim 30 wherein said means for monitoring comprises:
   an RF receiver for receiving each said resonance at its corresponding frequency; and
   means coupled to said RF receiver for generating a spectral map using each said resonance at first and second points in time, wherein changes between said spectral map associated with said first point in time and said spectral map associated with said second point in time at each said unique resonance frequency are indicative of changes in performance capacity of corresponding ones of said devices.

32. A system as in claim 27 wherein said inductor comprises a spiraled wire.

33. A system as in claim 27 wherein said first switch means and said second switch means are remotely controllable.

* * * * *